(12) United States Patent
Sun

(10) Patent No.: US 8,943,268 B2
(45) Date of Patent: Jan. 27, 2015

(54) TERNARY CONTENT ADDRESSABLE MEMORY (TCAM) STORAGE SYSTEM

(75) Inventor: Yan Sun, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 148 days.

(21) Appl. No.: 13/588,918

(22) Filed: Aug. 17, 2012

(65) Prior Publication Data

US 2014/0050002 A1 Feb. 20, 2014

(51) Int. Cl.
*G11C 15/00* (2006.01)
(52) U.S. Cl.
USPC .......................................... 711/108; 365/49.1
(58) Field of Classification Search
None
See application file for complete search history.

(56) References Cited

U.S. PATENT DOCUMENTS

| | | | |
|---|---|---|---|
| 6,018,524 A | 1/2000 | Turner et al. | |
| 6,717,946 B1 * | 4/2004 | Hariguchi et al. | 370/392 |
| 7,035,968 B1 * | 4/2006 | Pereira | 711/108 |
| 7,904,642 B1 * | 3/2011 | Gupta et al. | 711/108 |
| 8,122,189 B1 * | 2/2012 | Maheshwari | 711/108 |
| 2004/0078516 A1 * | 4/2004 | Henderson et al. | 711/108 |
| 2009/0135826 A1 * | 5/2009 | Kim et al. | 370/392 |
| 2010/0316051 A1 | 12/2010 | Song et al. | |
| 2013/0003727 A1 * | 1/2013 | Ramaraj et al. | 370/389 |

OTHER PUBLICATIONS

Rooney, et al., "An Associative Ternary Cache for IP Routing", pp. 1-14.

Sun, "Scalable Packet Processing for High-Speed Networks", Washington State University Dissertation, Dec. 2011.

Schluting, "On Your Network: What the Heck is a TCAM?", Aug. 12, 2005, retrieved from <http://enterprisenetworkingplanet.com/print/netsysm/.../On-Your-Network-What-the-Heck-is-a-TCAM.htm>.

Zheng, et al., "TCAM-based Distributed Parallel Packet Classification Algorithm with Range-Matching Solution", IEEE Transactions on Computers, Aug. 2006, pp. 947-961, vol. 55, Issue 8.

Agrawal, et al., "Modeling TCAM Power for Next Generation Network Devices", In Proceedings of IEEE International Symposium on Performance Analysis Systems and Software, 2006, pp. 1-10.

Kim, et al., "An Efficient IP Lookup Architecture with Fast Update Using Single-Match TCAMs", WWIC 2008, LNCS 5031, 2008, pp. 104-114.

Bremler-Barr, et al., "PEDS: A Parallel Error Detection Scheme for TCAM Devices", IEEE/ACM Transactions on Networking, 2010, pp. 1665-1675, vol. 18, Issue 5.

(Continued)

*Primary Examiner* — Charles Rones
*Assistant Examiner* — Tian-Pong Chang
(74) *Attorney, Agent, or Firm* — McDermott Will & Emery LLP

(57) ABSTRACT

A system for ternary content addressable memory (TCAM) storage may include a TCAM having multiple entries and a processor that is communicatively coupled to the TCAM. The processor may be operative to receive a first numerical range and determine a first ternary representation of a second numerical range that encompasses the first numerical range. The processor may be further operative to determine a second ternary representation corresponding to at least one of a lower bound or an upper bound of the first numerical range. The processor may be further operative to store a combination of the first and second ternary representations in one of the entries of the TCAM. In one or more implementations, the numerical range may be a port range and the combination of the ternary representations may be stored in one of the entries of the TCAM as a portion of a packet classification rule.

21 Claims, 7 Drawing Sheets

(56) References Cited

OTHER PUBLICATIONS

Yu, et al., "SSA: A Power and Memory Efficient Scheme to Multi-Match Packet Classification", ANCS '05, Oct. 26-28, 2005, pp. 105-113.
Kim, et al., "Extended TCAM for Adopting Range and Negation Rules in Packet Classification", Asia-Pacific Conference on Communications, 2006, pp. 1-4.
Taylor, et al., "ClassBench: A Packet Classification Benchmark", IEEE InfoCom, 2005, pp. 1-12.
"Evaluation of Packet Classification Algorithms", last updated on Feb. 13, 2007, retrieved from <http://www.arl.wustl.edu/~hs1/PClassEval.html>.
Sun, et al., "Tree-Based Minimization of TCAM Entries for Packet Classification", 7th IEEE Consumer Communications and Networking Conference, 2010, pp. 1-5.
Song, et al., "Toward Advocacy-Free Evaluation of Packet Classification Algorithms", IEEE Transactions on Computers, May 2011, pp. 723-733, vol. 60, No. 5.
Dharmapurikar, et al., "Fast Packet Classification Using Bloom Filters", Washington University in St. Louis—Department of Computer Science and Engineering, May 12, 2006, pp. 1-28.
"Chapter 4—Recursive Flow Classification: An Algorithm for Packet Classification on Multiple Fields", last viewed on Jun. 29, 2012, retrieved from <http://klamath.stanford.edu/~pankaj/thesis/chapter4.pdf>.
"Content-addressable memory", Wikipedia—The Free Encyclopedia, last viewed on Jun. 29, 2012, retrieved from <http://en.wikipedia.org/wiki/Content-addressable_memory>.
Sun, et al., "A Hybrid Approach to CAM-Based Longest Prefix Matching for IP Route Lookup", IEEE Global Telecommunications Conference (GLOBECOM 2010), 2010, pp. 1-5.
Waldvogel, et al., "Scalable High Speed IP Routing Lookups", Proceedings of the ACM SIGCOMM '97 Conference on Applications, Technologies, Architectures, and Protocols for Computer Communication, Oct. 1997, pp. 25-36, vol. 27, Issue 4.
Gupta, et al., "Packet Classification on Multiple Fields", Proceedings of the Conference on Applications, Technologies, Architectures, and Protocols for Computer Communication, Oct. 1999, pp. 147-160, vol. 29, Issue 4.
Baboescu, et al., "Packet Classification for Core Routers: Is there an alternative to CAMs?", Twenty-Second Annual Joint Conference of the IEEE Computer and Communications, 2003, pp. 53-63, vol. 1.
Singh, et al., "Packet Classification Using Multidimensional Cutting", SIGCOMM '03, Aug. 25-29, 2003, pp. 213-224.
Gupta, et al., "Packet Classification using Hierarchical Intelligent Cuttings", last viewed on Jun. 29, 2012, retrieved from <http://ece.ut.ac.ir/classpages/F83/Advanced%20Computer%20Networks/PAPERS/lookup/HOTI_99.pdf>.
Song, et al., "Efficient Packet Classification for Network Intrusion Detection using FPGA", Proceedings of the 2005 ACM/SIGDA—13th International Symposium on Field-Programmable Gate Arrays, 2005, pp. 238-245.
Song, et al., "Fast Filter Updates for Packet Classification using TCAM", IEEE Global Telecommunications Conference, 2006, pp. 1-5.
Hermsmeyer, et al., "Towards 100G Packet Processing: Challenges and Technologies", Bell Labs Technical Journal, 2009, pp. 57-80, vol. 14, No. 2.
Song, Design and Evaluation of Packet Classification Systems, Washington University Dissertation, Sep. 2006.
"ClassBench: A Packet Classification Benchmark", last viewed May 23, 2012, retrieved from <http://www.arl.wustl.edu/classbench/index.htm>.
Hua, et al., "Variable-Stride Multi-Pattern Matching for Scalable Deep Packet Inspection", IEEE InfoCom, 2009, pp. 415-423.
Song, et al., "Packet Classification Using Coarse-grained Tuple Spaces", Proceedings of the 2006 ACM/IEEE Symposium on Architecture for Networking and Communications Systems, 2006, pp. 41-50.
Dharmapurikar, et al., "Fast Packet Classification Using Bloom Filters", ANCS '06, Dec. 3-5, 2006, pp. 61-70.

* cited by examiner

| Rule | Type | Source IP | Destination IP | Source Port | Destination Port | Action |
|------|------|-----------|----------------|-------------|------------------|--------|
| r1 | TCP | * | 192.168.0.0/16 | <1024 | * | accept |
| r2 | TCP | * | 192.168.14.1 | * | 139 | discard |
| r3 | UDP | 192.168.0.0/16 | * | * | 700-900 | accept |
| r4 | TCP | * | * | * | * | discard |

FIG. 6 ly 268 B2

TERNARY CONTENT ADDRESSABLE MEMORY (TCAM) STORAGE SYSTEM

TECHNICAL FIELD

The present description relates generally to a storage system, and more particularly, but not exclusively, to a ternary content addressable memory storage system.

BACKGROUND

A ternary content-addressable memory (TCAM) is a type of memory that is designed to receive a data item that includes zeros, ones, or "*" values, and return a list of memory addresses, or a list of indices corresponding to entries of the TCAM, where the received data item is stored, if any. The "*" value may effectively be considered a mask value, or a wildcard value, such that a TCAM will return a match for a "*" value irrespective of the value being compared. TCAMs may be able to search their entire memory in one operation, making TCAMs considerably more efficient at searching than many other memory types. However, the efficient searching of TCAMs may come with the tradeoff of higher hardware and power consumption costs than those associated with other memory types.

TCAMs may be particularly well-suited for network devices that perform packet classification, such as routers, switches, etc., since these network devices often utilize network masks that effectively operate in the same manner as the mask value of the TCAM. A network device may be able to store ternary representations of all of its packet classification rules in TCAM entries, thereby allowing for an efficient lookup process for classifying packets, e.g. each TCAM entry may store a ternary representation of one packet classification rule, which may include ternary representations of one or more of: a protocol type, a source address, a destination address, a source port number, and a destination port number. For example, if the destination port range of a packet classification rule is zero through seven, then a TCAM entry containing the ternary representation of the rule may include 0000_0000_0000_0*** for the port range, when sixteen bits have been allocated to port numbers. Since the mask character matches a corresponding value of zero or a one, the destination port range portion of the example TCAM entry will match a sixteen bit representation of any destination port numbers from zero through seven.

However, it may not be possible in existing TCAM storage systems to store many of the port ranges frequently used in packet classification rules in a single TCAM entry. For example, any port range that has a lower bound greater than zero, such as the frequently used lower bound of one, would need to be stored across multiple TCAM entries, since the least significant bit of the portion of the TCAM entry corresponding to the port range must be one if all of the other bits are zero, but the least significant bit could be zero or one, if at least one of the other bits is one. For example, if the example port range discussed above were changed from zero through seven to one through seven, e.g. excluding only one additional port number (zero), the port range would require three TCAM entries, instead of only one, e.g. 0000_0000_0000_0001, 0000_0000_0000_001*, and 0000_0000_0000_01**. For similar reasons, a port range that has an upper bound that is less than 65535 may also require multiple TCAM entries. In the worst case scenario, e.g. a packet classification rule that has a port range of [1, 65534] for both the source port range and the destination port range, a total of nine hundred TCAM entries would be required to represent the packet classification rule.

BRIEF DESCRIPTION OF THE DRAWINGS

Certain features of the subject technology are set forth in the appended claims. However, for purpose of explanation, several embodiments of the subject technology are set forth in the following figures.

FIG. 6 illustrates an exemplary packet classification rule table in accordance with one or more implementations.

DETAILED DESCRIPTION

Figure 1:
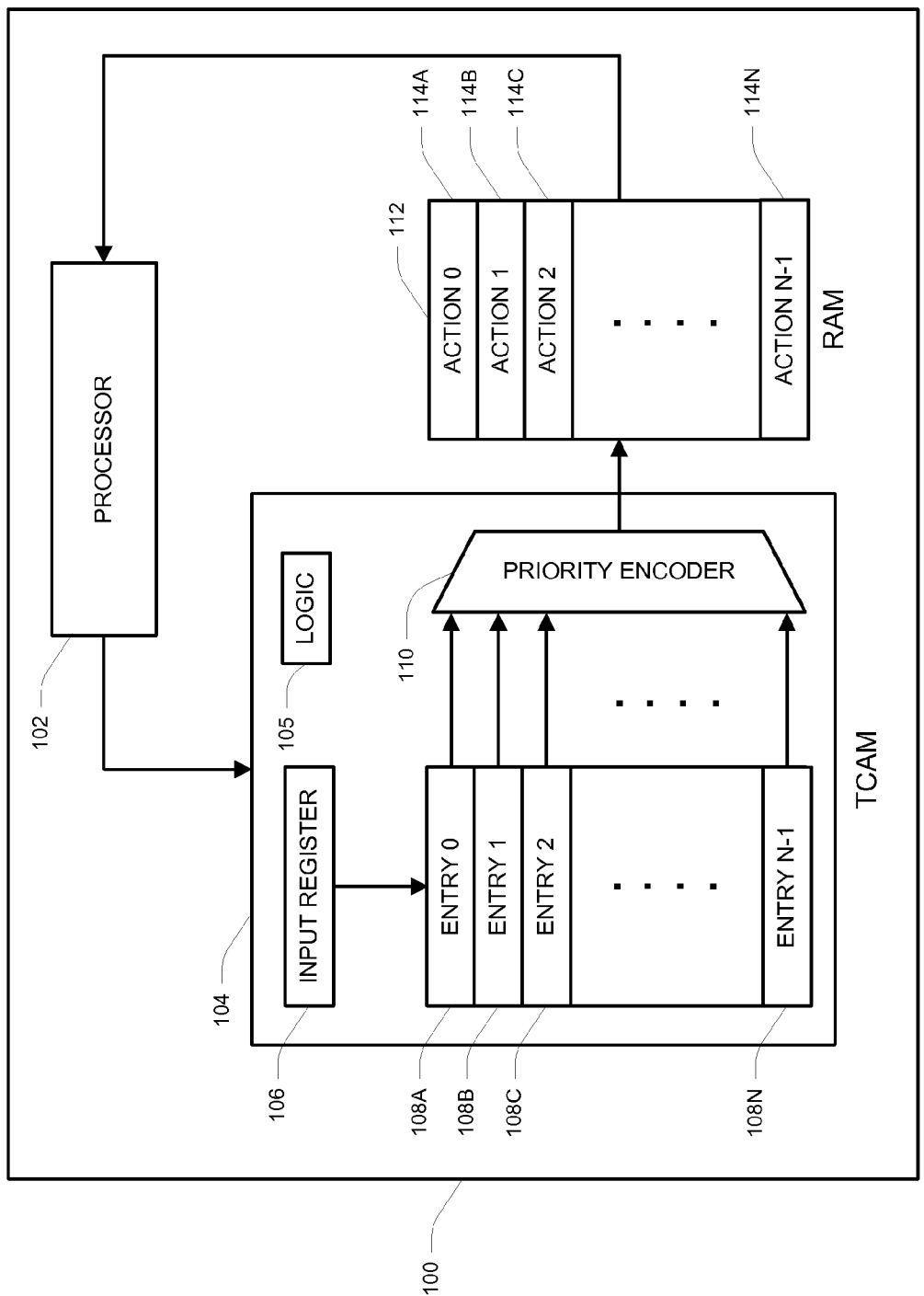
FIG. 1 illustrates an example device that may implement a TCAM storage system in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without one or more of these specific details. In one or more instances, well-known structures and components are shown in block diagram form in order to avoid obscuring the concepts of the subject technology.

In the subject ternary content addressable memory storage system, a port range, such as port range of a packet classification rule, may be stored in a single TCAM entry by storing a ternary representation that corresponds to a numerical range that encompasses the port range, along with ternary representations that correspond to the upper and/or lower bounds of the port range. Since configured TCAM entries often include more bit space than is utilized, the excess bit space of a TCAM entry can be used for storing the ternary representations corresponding to the upper and/or lower bounds of the port range. The upper and/or lower bounds may then be used to exclude the values from the stored numerical range that are above the upper bound or below the lower bound. Accordingly, a port range that excludes the value of zero, which requires several TCAM entries in previous TCAM storage systems, can be stored in a single TCAM entry in the subject TCAM storage system by storing a ternary representation of a numerical range that includes zero, along with a ternary representation of a lower bound of one, which may be used to exclude zero from the numerical range. In this manner, the number of TCAM entries required to store a packet classification rule that includes a port range can be reduced, thereby reducing the hardware and power consumption costs associated with TCAM storage systems.

In the subject TCAM storage system, packet classification rules that include port ranges that have a lower bound of 0 or $2^m$, and an upper bound of MAX_PORT_VALUE or MAX_PORT_VALUE$-2^n$, may be stored in a single TCAM entry, where the MAX_PORT_VALUE is the maximum port value that can be stored based on the number of bits allocated to port numbers, such as 65535 when sixteen bits are allocated to port numbers. In one or more implementations, the port range of [1, 65534], which requires up to thirty TCAM entries in previous TCAM storage entries, can be stored in a single TCAM entry in the subject TCAM storage system. Furthermore, although port ranges having upper and/or lower bounds that do not satisfy the aforementioned criteria may require more than one TCAM entry in the subject TCAM storage system, the number of TCAM entries required for storing any such port ranges in the subject TCAM storage system are reduced relative to previous TCAM storage systems.

In one or more implementations, forty-eight bits of a TCAM entry may be allocated to storing a port range of a packet classification rule. In these one or more implementations, the first sixteen bits of the forty-eight bits may be used to store a ternary representation corresponding to a numerical range that encompasses the entire port range, such as the smallest numerical range that can be represented as a single ternary string. In one or more implementations, for a given port range of [1, 65534], the smallest numerical range that encompasses the port range that can be represented as a single ternary string may be [0, 65535], e.g. ******_****, or **** ******. For explanatory purposes, the "_" character may be used as a separator for every eight bits within ternary representations. However, any character exclusive of one, zero, and the mask value, such as a space, can be used as a separator within the ternary representations, the separator can separate any number of bits, or the ternary representations may not include any separators.

The second sixteen bits of the forty-eight bits may be used to store a ternary representation corresponding to the lower bound of the port range and may be used to exclude any values below the lower bound from the numerical range. The ternary representation of the lower bound of the port range may be a ternary string that includes a value of one for the bit corresponding to the lower bound, e.g. $2^m$, and includes mask values, such as "*", for every remaining bit. In one or more implementations, for the given sixteen bit port range of [1, 65534], the second sixteen bits of the TCAM entry may store ******_*****1, which may be used to exclude the value of 0 from the numerical range of [0, 65535].

The third sixteen bits of the forty-eight bits may be used to store a ternary representation corresponding to the upper bound of the port range and may be used to exclude any values above the upper bound from the numerical range. The ternary representation of the upper bound of the port range may be a ternary string that includes a value of zero for the bit corresponding to the value being subtracted from the maximum port value, e.g. the bit corresponding to $2^n$ for the example of MAX_PORT_VALUE$-2^n$, and that includes mask values, such as "*", for each remaining bit. In one or more implementations, for the given port range of [1, 65534], when the maximum port value is 65535 the upper bound of 65534 corresponds to a value of one being subtracted from the maximum port value of 65535. Thus, the ternary representation of the upper bound may include a zero value for the bit corresponding to the value being subtracted from the upper bound, e.g. one in the current example. Accordingly, for the given port range of [1, 65534], the upper bound of 65534 may be represented as "******_*****0", which may be used to exclude the value of 65535 from the numerical range of [0, 65535]. Thus, the entire port range of [1, 65534], which requires up to thirty TCAM entries in previous TCAM storage systems, can be stored in the subject TCAM storage system as part of a single TCAM entry as:
******_****_****_***1_****_*****0.

In order to utilize the efficient lookup properties of the TCAM, a port number of an incoming packet header, such as a destination port number and/or a source port number, must be processed to generate a value that can be directly compared against the port range portions of the packet classification rules stored in the TCAM entries of the subject TCAM storage system. Thus, a port number of an incoming packet header must be processed to generate additional values that can be compared against the stored ternary representations corresponding to the upper and/or lower bounds of the port ranges of the packet classification rules. In one or more implementations, a port number of an incoming packet header may be processed using a bitwise AND function to generate a value to be compared against the ternary representation corresponding to the upper bound and a bitwise OR function to generate a value to be compared against the ternary representation corresponding to the lower bound.

In one or more implementations, to generate an upper bound comparator to be compared against the ternary representation of the upper bound of a port range, the most significant bit of the upper bound comparator may be set to the most significant bit of the incoming port number, and each successive less-significant bit of the upper bound comparator may be set to the result of an AND operation performed on each successive less-significant bit of the port number and the most recently set bit of the upper bound comparator. In one or more implementations, the operation used to set the bits of the upper bound comparator may be referred to as an AND bitmap operation. Similarly, to generate a lower bound comparator to be compared against the lower bound of a port range, the most significant bit of the lower bound comparator may be set to the most significant bit of the incoming port number, and each successive less-significant bit of the lower bound comparator may be set to the result of an OR operation performed on each successive less-significant bit of the port number and the most recently set bit of the lower bound comparator. In one or more implementations, the operation used to set the bits of the lower bound comparator may be referred to as an OR bitmap operation.

The values generated from the bitwise operations may be combined with the port number of the incoming packet header. In one or more implementations, the resulting combination may be further combined with other values parsed from the incoming packet header, such as a source address, a destination address, a protocol type, or a value corresponding to another port number. The final combination of values may be provided as input to the TCAM for comparison against the stored TCAM entries. The TCAM may output a signal that may be used to retrieve an action from random access memory (RAM) that indicates how the received packet should be handled.

For exemplary purposes, the subject TCAM storage system is described herein with reference to sixteen bit port numbers; however, the subject TCAM storage system can operate using any number of bits allocated to port numbers, subject to an upper limit corresponding to the amount of excess bit space available in configured TCAM entries. Further for exemplary purposes, the subject TCAM storage system is described herein with reference to ternary representations corresponding to an upper bound and a lower bound of a port range. However, the ternary representation corresponding to the lower bound may be excluded for port ranges that start at zero, and the ternary representation corresponding to the upper bound may be excluded for port ranges that extend to the maximum port value, such as 65535 when sixteen bits are allocated to the port number. Further for exemplary purposes, the subject TCAM storage system is described herein with references to storing ternary representations of port ranges; however, the subject TCAM storage system may be used to store ternary representations of any numerical ranges. Further for exemplary purposes, the subject TCAM storage system is described herein with reference to packet routing, such as through packet classification rules and/or routing tables; however, the subject TCAM storage system may be used to store ternary representations of numerical ranges for any purpose, such as security scanning or pattern matching.

FIG. 1 illustrates example device 100 that may implement a TCAM storage system. Not all of the depicted components may be required, however, and one or more implementations may include additional components not shown in the figure. Variations in the arrangement and type of the components may be made without departing from the spirit or scope of the claims as set forth herein. Additional, different or fewer components may be provided.

Device 100 may include processor 102, TCAM 104, and random access memory (RAM) 112. TCAM 104 may include input register 106, TCAM entries 108A-N, logic 105, and priority encoder 110. RAM 112 may include RAM entries 114A-N. In one or more implementations, RAM 112 and TCAM 104 may be on the same integrated circuit (IC), or on separate ICs. In one or more implementations, device 100 may be a network device, such as a router, a switch, or generally any device that may receive and/or forward packets. As previously discussed, device 100 may include additional components that are not shown. In one or more network device implementations, device 100 may further include at least a network interface. Example additional components that may be included in device 100 are discussed further below with respect to FIG. 7.

TCAM entries 108A-N may store information, such as ternary representations of packet classification rules. In one or more implementations, a packet classification rule may include values corresponding to one or more of: a protocol type, such as a transport control protocol (TCP), a user datagram protocol (UDP), or generally any network protocol, a source network address, such as a source internet protocol (IP) address, a destination network address, such as a destination IP address, a source port number or port range, a destination port number or port range, and/or any other values that may be used to classify packets. The ternary representations of the packet classification rules may be generated and stored in TCAM entries 108A-N as described herein, for example based at least in part on the process described below with respect to FIG. 3. Logic 105 may include additional logic and/or registers that may be used by TCAM 104, such as by priority encoder 110, to perform any of the operations described herein.

A packet classification rule may be associated with an action for handling an incoming packet that has a header that satisfies the criteria of the packet classification rule. The actions for handling a packet may include, for example, accepting the packet, rejecting the packet, discarding the packet, or generally any action that may be performed on an incoming packet. Example packet classification rules and associated actions are discussed further below with respect to FIG. 6. TCAM entries 108A-N may correspond to RAM entries 114A-N that store actions associated with the packet classification rules that are stored in TCAM entries 108A-N. In one or more implementations, TCAM entry 108A may correspond to RAM entry 114A that stores the action associated with the packet classification rule stored in TCAM entry 108A.

In operation, processor 102 may provide input values to TCAM 104, such as by storing an input value in input register 106 of TCAM 104. In one or more implementations, processor 102 may receive an incoming packet and may parse one or more values from a header of the packet. In one or more implementations, the parsed values may be concatenated together and stored in input register 106 of TCAM 104 as an input value. In one or more implementations, the values parsed from the header of the packet may include one or more of: a protocol type, a source address, a destination address, a source port, a destination port, or generally any other values that may be included in the header of the packet. If the values parsed from the header include a source port and/or a destination port, the source port and/or destination port may be processed as described herein, for example as described below with respect to FIG. 4.

TCAM 104 then compares the input value stored in input register 106, such as the concatenated values parsed from the header of an incoming packet, to the ternary representations stored in TCAM entries 108A-N, such as ternary representations of packet classification rules. TCAM 104 can compare the value stored in input register 106 with all of TCAM entries 108A-N in parallel. TCAM 104 may generate a value of one for any TCAM entries 108A-N that match the value stored in input register 106, and a value of zero for any TCAM entries 108A-N that do not match the value stored in input register 106. The one and zero values may be provided to priority encoder 110. In one or more implementations, the one and zero values are stored in a bit vector that is provided to priority encoder 110. If multiple TCAM entries 108A-N match the value stored in input register 106, priority encoder 110 selects one of TCAM entries 108A-N having the highest priority. In one or more implementations, priority encoder 110 may select the matching TCAM entry 108A that is stored first in TCAM 104 as having the highest priority. In these one or more implementations, TCAM entry 108A labeled "ENTRY 0" in TCAM 104 of FIG. 1 may have the highest priority, while TCAM entry 108N labeled "ENTRY N-1" may have the lowest priority in TCAM 104 of FIG. 1, or vice-versa.

The output signal generated by priority encoder 110 is used to select one of RAM entries 114A-N storing the appropriate action for handling the incoming packet, such as RAM entry 114A. In one or more implementations, the index of the selected TCAM entry 108A may be used to select the appropriate RAM entry 114A. The action stored in the selected RAM entry 114A may be provided to processor 102, and processor 102 may handle the incoming packet in accordance with the action.

Figure 2:
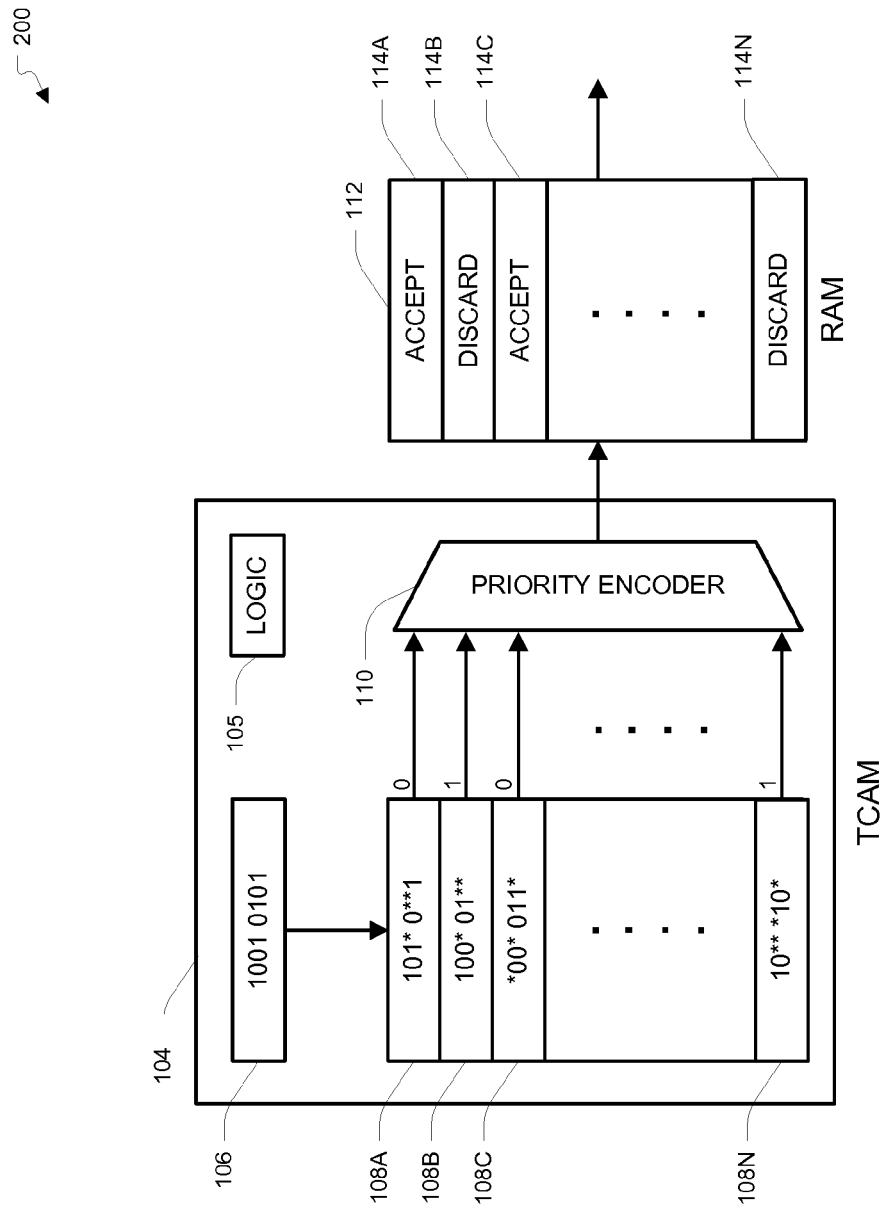
FIG. 2 illustrates an example TCAM storage system in accordance with one or more implementations.

FIG. 2 illustrates example TCAM storage system 200 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional, different or fewer components may be provided.

TCAM storage system 200 includes TCAM 104, logic 105, input register 106, TCAM entries 108A-N, priority encoder 110, RAM 112, and RAM entries 114A-N. In operation, values that have been extracted from a header of a received packet may be concatenated and stored in input register 106, such as values corresponding to one or more of source address, destination address, source port, destination port, and/or protocol type. For explanatory purposes, only eight bits are allocated to any of input register 106 and TCAM entries 108A-N in TCAM storage system 200. However, in one or more implementations, such as when TCAM 104 is used in network devices, additional bits may be allocated to any of TCAM entries 108A-N and/or input register 106, such as 72 bits, 144 bits, or 288 bits.

In TCAM storage system 200, input register 106 has been set to "1001 0101." TCAM 104 compares the value stored in input register 106, e.g. 1001 0101, to any of TCAM entries 108A-N in parallel. In one or more implementations, TCAM 104 compares the value stored in input register 106, e.g. 1001 0101, to the ternary string stored in TCAM entry 108A, e.g. "101* 0**1". As previously discussed, in order for given TCAM entry 108A to match input register 106, each bit of TCAM entry 108A must be equivalent to the corresponding bit of input register 106, with the exception that any bits of TCAM entry 108A that have a mask value will match any value for the corresponding bit of input register 106. Thus, TCAM entry 108A, e.g. 101* 0**1, does not match the value stored in input register 106, e.g. 1001 0101, because the third most significant bit of TCAM entry 108A is one, while the third most significant bit of the value stored in input register 106 is zero.

In one or more implementations, TCAM 104 simultaneously compares the value stored in input register 106, e.g. 1001 0101, to the ternary string stored in TCAM entry 108B, e.g. "100* 01**". TCAM entry 108B, e.g. 100* 01**, matches the value stored in input register 106, because each non-mask bit value of TCAM entry 108B is equivalent to the corresponding bit of input register 106. TCAM 104 simultaneously compares the value stored in input register 106 to remaining TCAM entries 108C-N. In TCAM storage system 200, a one value is generated for TCAM entries 108B and 108N, because TCAM entries 108B and 108N match input register 106, while a zero value is generated for TCAM entries 108A and 108C, because TCAM entries 108A and 108C do not match input register 106.

The one and zero values generated for TCAM entries 108A-N are provided to priority encoder 110. Priority encoder 110 selects the highest priority TCAM entry 108B for which a value of one was generated. In one or more implementations, the highest priority TCAM entry 108B may be TCAM entry 108B that is stored first in TCAM 104. Thus, in TCAM storage system 200, priority encoder 110 may select TCAM entry 108B, e.g. "100* 01**", since TCAM entry 108B is the first stored TCAM entry 108B that generated a value of one, e.g. that matched input register 106.

Priority encoder 110 may output a signal used to select RAM entry 114B corresponding to the selected TCAM entry 108B. In one or more implementations, priority encoder 110 may provide the index of the selected TCAM entry 108B to RAM 112. RAM 112 may output the value stored in RAM entry 114B corresponding to the provided index, e.g. the index value of one may correspond to RAM entry 114B, and therefore RAM 112 may output a value that is indicative of a "DISCARD" action. Thus, the received packet corresponding to the values stored in input register 106 may be discarded.

Figure 3:
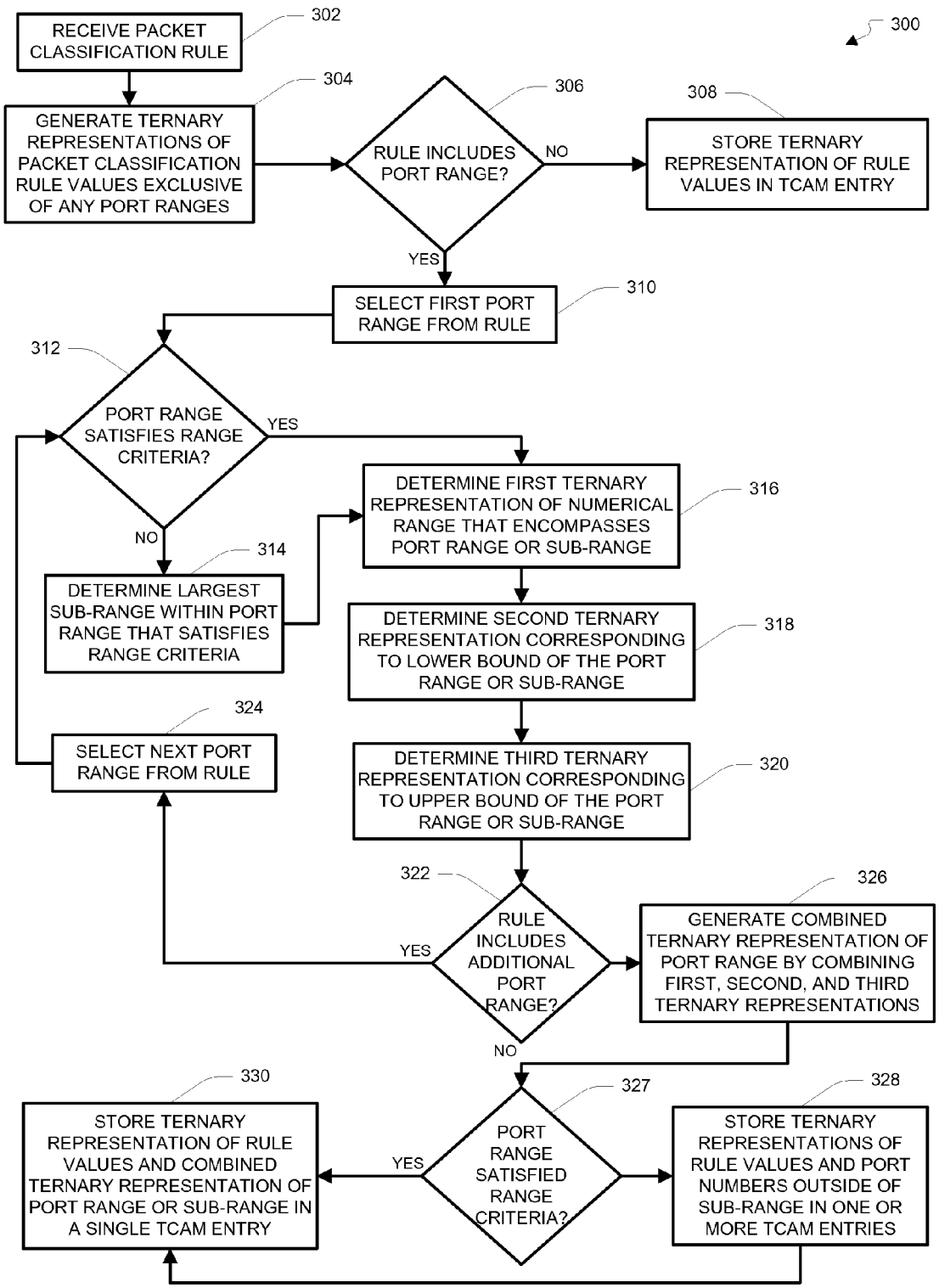
FIG. 3 illustrates a flow diagram of an example process for storing information in a TCAM storage system in accordance with one or more implementations.

FIG. 3 illustrates a flow diagram of example process 300 for storing information in a TCAM storage system in accordance with one or more implementations. For explanatory purposes, example process 300 is described herein with reference to example device 100 of FIG. 1 and/or example TCAM storage system 200 of FIG. 2; however, example process 300 is not limited to example device 100 of FIG. 1 and/or example TCAM storage system 200 of FIG. 2. Further for explanatory purposes, the blocks of example process 300 are described herein as occurring in serial, or linearly. However, multiple blocks of example process 300 may occur in parallel. In addition, the blocks of example process 300 need not be performed in the order shown.

A network device, such as device 100, or one or more components thereof or coupled thereto, such as processor 102, may receive a packet classification rule (302). In one or more implementations, a packet classification rule may be input into device 100, such as through a user interface. The packet classification rule may include one or more values corresponding to one or more criteria, such as source internet protocol (IP) address, destination IP address, source port, such as a port number or a port range, destination port, such as a port number or a port range, protocol type, or generally any criteria that may be used to classify a packet. Device 100 generates ternary representations of the values of the packet classification rule, such as ternary strings or prefixes, exclusive of the values of any port ranges included in the packet classification rule (304). In one or more implementations, device 100 may concatenate the ternary representations together to form a combined ternary representation of the values of the packet classification rule exclusive of any port ranges, such as a single ternary string.

Device 100 determines whether the packet classification rule includes a port range (306). If device 100 determines that the packet classification rule does not include a port range (306), device 100 stores the combined ternary representation of the packet classification rule values in TCAM entry 108A of TCAM 104 (308). In one or more implementations, device 100 may append mask values, such as "*", to the combined ternary representation for any bits allocated to the source port or destination port prior to storing the combined ternary representation of the packet classification rule values in TCAM entry 108A of TCAM 104. Alternatively, or in addition, if the packet classification rule includes a single port number corresponding to the source port and/or a single port number corresponding to the destination port, device 100 may append ternary representations of the port numbers (which in this case may only include values of zero or one) to the combined ternary representation of the packet classification rule values prior to storing the combined ternary representation of the packet classification rule values in TCAM entry 108A of TCAM 104.

If device 100 determines that the packet classification rule includes at least one port range (306), device 100 selects the first port range from the packet classification rule, such as a source port range or a destination port range (310). Device 100 determines whether the port range satisfies one or more port criteria (312). In one or more implementations, device 100 may determine whether the port range has a lower bound that equals 0 or $2^m$, and an upper bound that equals MAX_PORT_VALUE or MAX_PORT_VALUE-$2^n$, where the MAX_PORT_VALUE is the maximum port value that can be stored based on the number of bits allocated to port numbers, such as 65535 when sixteen bits are allocated to port numbers.

If device 100 determines that the port range does not satisfy the port criteria (312), device 100 determines the largest sub-range within the port range that satisfies the criteria (314) and determines a first ternary representation of the largest sub-range (316). In one or more implementations, if the lower bound of the port range is $2^m-1$, and the upper bound of the port range is MAX_PORT_VALUE-$2^n$, then the largest sub-range within the port range that satisfies the criteria may be a sub-range having a lower bound of $2^m$ and an upper bound of MAX_PORT_VALUE$-2^n$.

If device 100 determines that the port range satisfies the range criteria (312), device 100 determines a first ternary representation of a numerical range that encompasses the entire port range (316). In one or more implementations, the numerical range may be the smallest numerical range that can be represented as a single ternary string. In one or more implementations, for a given port range of [1, 65534], the smallest numerical range that encompasses the port range that can be represented as a single ternary string may be [0, 65535], e.g. "******_******", when sixteen bits are allocated to the port number.

Device 100 determines a second ternary representation that corresponds to the lower bound of the port range, or the port sub-range when the port range does not satisfy the port criteria (318). The ternary representation of the lower bound of the port range or sub-range may be a ternary string that includes a value of one for the bit corresponding to the lower bound, e.g. $2^m$, and that includes mask values, such as "*", for every remaining bit. In one or more implementations, for the given port range of [1, 65534], the lower bound of 1 may be represented as "******_***1". Alternatively, for the given port range of [4, 65534], the lower bound of 4 may be represented as "****_*1". Alternatively, if the lower bound of the port range is 0, then device 100 may not determine a second ternary representation of the lower bound.

Device 100 determines a third ternary representation that corresponds to the upper bound of the port range, or the port sub-range when the port range does not satisfy the port criteria (320). The ternary representation of the upper bound of the port range or sub-range may be a ternary string that includes a value of zero for the bit corresponding to the amount being subtracted from the maximum port value, e.g. $2^n$ when the port range criteria includes an upper bound criteria of MAX P_ORT_VALUE$-2^n$, and that includes mask values, such as "*", for every remaining bit. In one or more implementations, for the given port range of [1, 65534] when the maximum port value is 65535, the upper bound of 65534 corresponds to a value of 1 being subtracted from the maximum port value of 65535. Thus, the ternary representation of the upper bound may include a 0 value for the bit corresponding to the amount being subtracted from the upper bound, e.g. one in the current example. Accordingly, for the given port range of [1, 65534], the upper bound of 65534 may be represented as "******_***0". Alternatively, for the given port range of [1, 65527], the upper bound of 65527 may be represented as "****_0*". Alternatively, if the upper bound of the port range is the maximum port value, such as 65535 when sixteen bits are allocated to the port number, then device 100 may not determine a third ternary representation of the upper bound.

Device 100 determines whether the packet classification rule includes an additional port range (322). In one or more implementations, any packet classification rules may include both a source port range and a destination port range. If device 100 determines that the packet classification rule includes an additional port range (322), device 100 selects the next port range from the packet classification rule (324) and repeats (312-320) for the next port range.

If device 100 determines that the packet classification rule does not include any additional port ranges (322), device 100 generates a combined ternary representation of the port range by combining at least two of the first ternary representation, the second ternary representation, or the third ternary representation (326). In one or more implementations, if the lower bound of the port range is 0 and therefore device 100 did not generate a second ternary representation, then device 100 may only combine the first ternary representation and the third ternary representation. Alternatively, if the upper bound of the port range is the maximum port value, and therefore device 100 did not generate the third ternary representation, then device 100 may only combine the first ternary representation and the second ternary representation. Alternatively, if device 100 generated first, second, and third ternary representations, then device 100 may combine the first, second, and third ternary representations. In one or more implementations, device 100 may concatenate the ternary representations to generate the combined ternary representation, with and without separators.

In one or more implementations, device 100 may include a separator, such as "_" between each of the first, second, and third ternary representations. Thus if the first ternary representation is "******_****", the second ternary representation is "****_***1", and the third ternary representation is "****_***0", then device 100 may generate a combined ternary representation of "****_****_****_***1_****_*****0". Device 100 determines whether the port range satisfied the port range criteria (327), e.g. whether a port sub-range was used (316-326).

If device 100 determines that the port range did not satisfy the port criteria (327), e.g. a port sub-range was used (316-326), device 100 stores a combination of the combined ternary representation of the packet classification rule values exclusive of the port ranges, and one or more ternary representations of the port numbers of the port range that are outside of the port sub-range, in one or more TCAM entries 108A-N of TCAM 104 (328). In one or more implementations, device 100 may concatenate the combined ternary representation of the packet classification rule values to the ternary representations of the port numbers, with or without a separator. In one or more implementations, for a given port range of [$2^m-2$, MAX_PORT_VALUE$-2^n$] a sub-range of [$2^m$, MAX_PORT_VALUE$-2^n$] may be used. In these one or more implementations, in device 100 may store a combination of the combined ternary packet classification rule values and a ternary representation corresponding to port number $2^m-1$ and $2^m-2$ in one or more TCAM entries 108A-N of TCAM 104 (328). In one or more implementations, it may not be possible to generate a single ternary string that includes both the port numbers $2^m-1$ and $2^m-2$. In these one or more implementations, device 100 may store a combination of the packet classification rule values and a ternary representation of $2^m-1$ in TCAM entry 108A of TCAM 104, and a combination of the packet classification rule values and a ternary representation of $2^m-2$ in TCAM entry 108B of TCAM 104. However, device 100 may utilize ternary representations of the port numbers of the port range that are outside of the sub-range to substantially minimize the number of TCAM entries 108A-N required to store the combination of the packet classification rule values and the port numbers that are outside of the sub-range.

If device 100 determines that the port range satisfied the port range criteria (327), e.g. a port range was used (316-326) rather than a port sub-range, device 100 stores a combination of the combined ternary representation of the packet classification rule values exclusive of the port ranges, and the combined ternary representation of the port range, in single TCAM entry 108A of TCAM 104 (330). In one or more implementations, device 100 may concatenate the combined ternary representation of the packet classification rule values to the combined ternary representation of the port range, with or without a separator.

Figure 4:
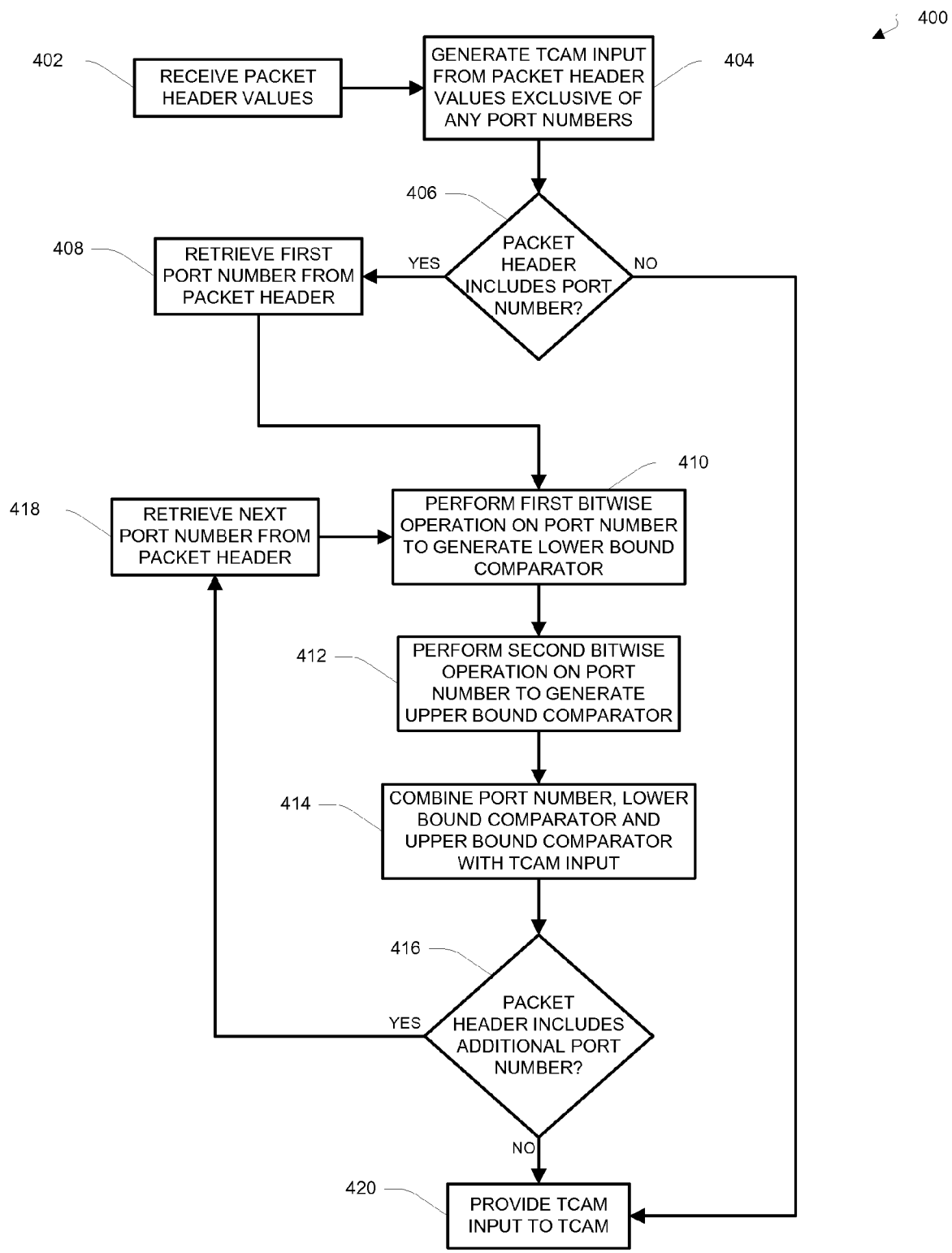
FIG. 4 illustrates a flow diagram of an example process for retrieving information in a TCAM storage system in accordance with one or more implementations.

FIG. 4 illustrates a flow diagram of example process 400 for retrieving information in a TCAM storage system in accordance with one or more implementations. For explanatory purposes, example process 400 is described herein with reference to example device 100 of FIG. 1 and/or example TCAM storage system 200 of FIG. 2; however, example process 400 is not limited to example device 100 of FIG. 1 and/or example TCAM storage system 200 of FIG. 2. Further for explanatory purposes, the blocks of example process 400 are described herein as occurring in serial, or linearly. However, multiple blocks of example process 400 may occur in parallel. In addition, the blocks of example process 400 need not be performed in the order shown.

A network device, such as device 100, or one or more components thereof or coupled thereto, such as processor 102, receives packet header values (402). In one or more implementations, device 100 may parse packet header values from the header of an incoming packet. In one or more implementations, the packet header values may include values that correspond to one or more of: source and/or destination addresses, source and/or destination ports, protocol type, and/or any other values that may be parsed from a packet header. Device 100 may generate a TCAM input value, such as an input string, from any packet header values exclusive of any port numbers (404). In one or more implementations, device 100 may concatenate the packet header values, with or without a separator. In one or more implementations, device 100 may concatenate the packet header values in an order that coincides with the order in which the corresponding values of the packet classification rules are concatenated in the ternary representations stored in TCAM entries 108A-N of TCAM 104.

Device 100 may determine whether the packet header includes one or more port numbers (406), such as a destination port number or a source port number. If device 100 determines that the packet header does not includes a port number (406), device 100 provides the TCAM input value to TCAM 104 (420). In one or more implementations, processor 102 may store the TCAM input value in input register 106 of TCAM 104. In response to storing the TCAM input value in input register 106, processor 102 may receive an action value from RAM 112, such as accept, discard, etc., and processor 102 may handle the incoming packet in accordance with the received action value.

If device 100 determines that the packet header includes at least one port number (406), device 100 retrieves the first port number from the packet header (408), such as the destination port number or the source port number. Device 100 performs a first bitwise operation on the port number to generate a lower bound comparator (410). In one or more implementations, device 100 may perform a bitwise OR operation on the port number to generate the lower bound comparator. Device 100 performs a second bitwise operation on the port number to generate a upper bound comparator (412). In one or more implementations, device 100 may perform a bitwise AND operation on the port number to generate the upper bound comparator. The process of performing the bitwise OR operation and the bitwise AND operation is described below with respect to FIG. 5.

Device 100 combines the port number, the lower bound comparator, and the upper bound comparator with the generated TCAM input value (414). In one or more implementations, device 100 may concatenate the port number, the lower bound comparator, and the upper bound comparator with the TCAM input value, with or without separators. In one or more implementations, the port number, the lower bound comparator, and the upper bound comparator are concatenated to the TCAM input value, or inserted into the TCAM input value, in an order that coincides with the order in which the corresponding values of the packet classification rules are concatenated in the ternary representations stored in TCAM entries 108A-N of TCAM 104.

Device 100 determines whether the packet header includes an additional port number (416), such as a source port number, or a destination port number. If device 100 determines that the packet header includes an additional port number (416), device 100 retrieves the next port number for the packet header (418) and repeats (410-414) using the next port number. If device 100 determines that there are no additional port numbers included in the packet header (416), device 100 provides the TCAM input value to TCAM 104 (420). In one or more implementations, processor 102 may store the TCAM input value in input register 106 of TCAM 104. In response to storing the TCAM input value in input register 106, processor 102 may receive an action value from RAM 112, such as accept, discard, etc., and processor 102 may handle the incoming packet in accordance with the received action value.

Figure 5:
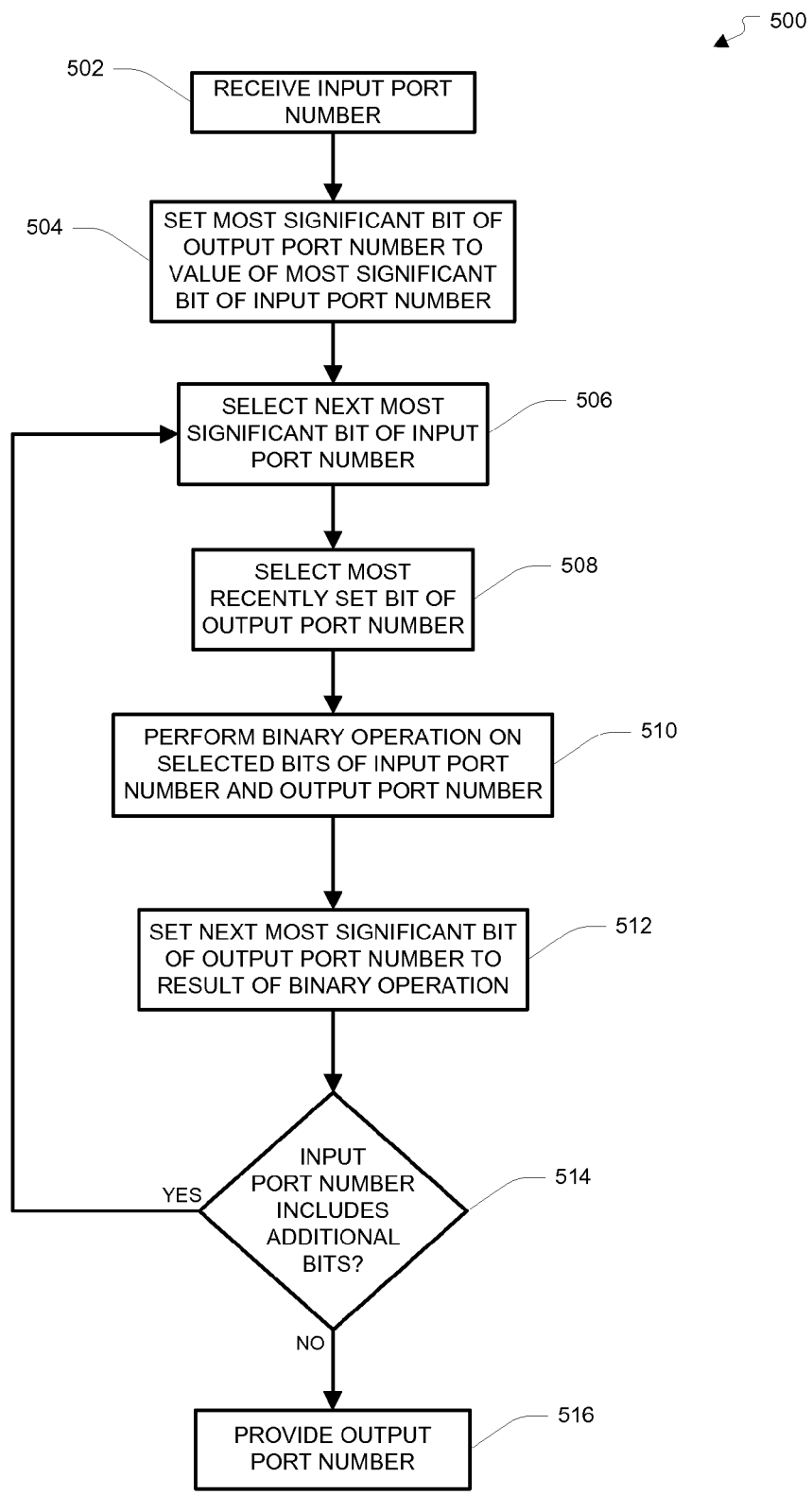
FIG. 5 illustrates a flow diagram of an example process for a bitwise operation in a TCAM storage system in accordance with one or more implementations.

FIG. 5 illustrates a flow diagram of example process 500 for a bitwise operation in a TCAM storage system in accordance with one or more implementations. For explanatory purposes, example process 500 is described herein with reference to example device 100 of FIG. 1 and/or example TCAM storage system 200 of FIG. 2; however, example process 500 is not limited to example device 100 of FIG. 1 and/or example TCAM storage system 200 of FIG. 2. Further for explanatory purposes, the blocks of example process 500 are described herein as occurring in serial, or linearly. However, multiple blocks of example process 500 may occur in parallel. In addition, the blocks of example process 500 need not be performed in the order shown.

A network device, such as device 100, or one or more components thereof or coupled thereto, such as processor 102, receives an input port number (502), such as a source port number or a destination port number, for which a bitwise operation is to be performed, such as a bitwise OR operation, or a bitwise AND operation. Device 100 sets the most significant bit of an output port number, e.g. the resultant port number after the bitwise operation is performed on the input port number, to the value of the most significant bit of the input port number (504). Thus, device 100 copies the value of the most significant bit of the input port number to the most significant bit of the output port number.

Device 100 selects the next most significant bit of the input port number (506). In one or more implementations, if the most significant bit was the most recently processed bit, then device 100 selects the second most significant bit of the input port number. Device 100 selects the most recently set bit of the output port number (508). In one or more implementations, if the most significant bit of the output port number was the most recently set bit, then device 100 selects the most significant bit of the output port number. Device 100 performs a binary operation on the selected bits of the input port number and the output port number (510). In the instance of a bitwise OR operation, such as when device 100 is generating a lower bound comparator, device 100 may perform a binary OR operation on the selected bits. Alternatively, in the instance of a bitwise AND operation, such as when device 100 is generating an upper bound comparator, device 100 may perform a binary AND operation on the selected bits.

Device 100 sets the next most significant bit of the output port number to the result of the binary operation (512). In one or more implementations, if device 100 performed the binary operation on the most significant bit of the output port number (510), then device 100 may set the second most significant bit of the output port number to the result of the binary operation (512). Device 100 determines whether the input port number includes any additional bits that have not been processed (514). If device 100 determines that the input port number includes additional bits (514), device 100 repeats (506-512) using the next most significant bit of the input port number. If device 100 determines that there are no additional bits of the input port number that have not been processed (514), device 100 provides the output port number, such as for concatenating with a TCAM input value (516).

FIG. 6 illustrates example packet classification rule table 600 in accordance with one or more implementations. Table 600 includes seven columns 602A-G that correspond to different types of values that may be used in packet classification rules in accordance with one or more implementations. Column 602A corresponds to a rule index, column 602B corresponds to a protocol type, column 602C corresponds to a source IP address, column 602D corresponds to a destination IP address, column 602E corresponds to a source port, column 602F corresponds to a destination port, and column 602G corresponds to an associated action.

Table 600 further includes four rows 604A-D that each include a packet classification rule having values for seven columns 602A-G. In order to generate a ternary representation of a given packet classification rule, the values corresponding to column 602B, e.g. protocol type, column 602C, e.g. source IP address, and column 602D, e.g. destination IP address, may be combined. The ranges corresponding to columns 602E-F, e.g. the source port and the destination port, may be processed as described herein, such as in the manner described with respect to FIG. 3, such that any of the port ranges can be represented as a single ternary representation, e.g. a single ternary string. The ternary representations of the port ranges may be combined with the ternary representations of the other values in the packet classification rule to generate a ternary representation of the packet classification rule that can be stored in single TCAM entry 108A.

Figure 7:
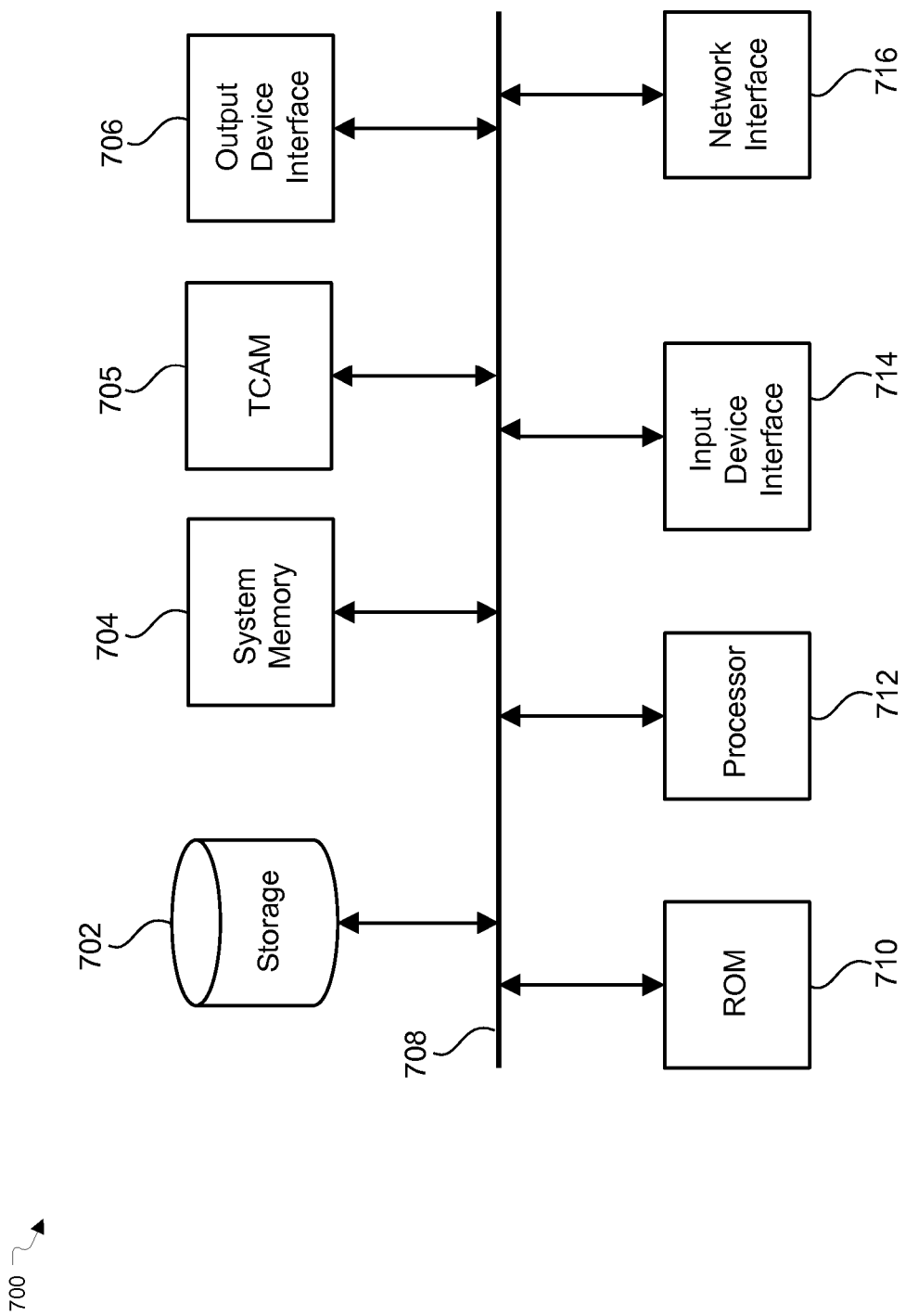
FIG. 7 conceptually illustrates an electronic system with which any implementations of the subject technology may be implemented.

FIG. 7 conceptually illustrates electronic system 700 with which any implementations of the subject technology are implemented. Electronic system 700 can be a switch, a router, a base station, a receiver, a phone, a PDA, a tablet computer, any device that performs packet classification and/or packet routing, or generally any electronic device that transmits signals over a network. Such an electronic system includes various types of computer readable media and interfaces for various other types of computer readable media. Electronic system 700 includes bus 708, processing unit(s) 712, system memory 704, TCAM 705, read-only memory (ROM) 710, permanent storage device 702, input device interface 714, output device interface 706, and network interface 716, or subsets and variations thereof.

Bus 708 collectively represents all system, peripheral, and chipset buses that communicatively connect the numerous internal devices of electronic system 700. In one or more implementations, bus 708 communicatively connects processing unit(s) 712 with ROM 710, system memory 704, and permanent storage device 702. From these various memory units, processing unit(s) 712 retrieves instructions to execute and data to process in order to execute the processes of the subject disclosure. The processing unit(s) can be a single processor or a multi-core processor in different implementations.

TCAM 705 includes multiple entries that may store information, such as a ternary representation of a packet classification rule. System memory 704, and/or ROM 710 may store information, such as an action corresponding to the packet classification rules stored in TCAM 705.

ROM 710 stores static data and instructions that are needed by processing unit(s) 712 and other modules of the electronic system. Permanent storage device 702, on the other hand, is a read-and-write memory device. This device is a non-volatile memory unit that stores instructions and data even when electronic system 700 is off. One or more implementations of the subject disclosure use a mass-storage device (such as a magnetic or optical disk and its corresponding disk drive) as permanent storage device 702.

Other implementations use a removable storage device (such as a floppy disk, flash drive, and its corresponding disk drive) as permanent storage device 702. Like permanent storage device 702, system memory 704 is a read-and-write memory device. However, unlike storage device 702, system memory 704 is a volatile read-and-write memory, such a random access memory. System memory 704 stores any of the instructions and data that the processor needs at runtime. In one or more implementations, the processes of the subject disclosure are stored in system memory 704, permanent storage device 702, and/or ROM 710. In one or more implementations, the various memory units may include instructions for storing and/or retrieving information from TCAM 705, such as storing ternary representations of packet classification rules in the entries of TCAM 705, or retrieving one or more index values, or memory addresses, from TCAM 705. From these various memory units, processing unit(s) 712 retrieves instructions to execute and data to process in order to execute the processes of one or more implementations.

Bus 708 also connects to input and output device interfaces 714 and 706. Input device interface 714 enables the user to communicate information and select commands to the electronic system. Input devices used with input device interface 714 include, for example, alphanumeric keyboards and pointing devices (also called "cursor control devices"). Output device interfaces 706 enables, for example, the display of images generated by the electronic system 700. Output devices used with output device interface 706 include, for example, printers and display devices, such as a liquid crystal display (LCD), a light emitting diode (LED) display, an organic light emitting diode (OLED) display, a flexible display, a flat panel display, a solid state display, a projector, or any other device for outputting determined information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 7, bus 708 also couples electronic system 700 to a network (not shown) through network interface 716. In this manner, the computer can be a part of a network of computers (such as a local area network ("LAN"), a wide area network ("WAN"), or an Intranet, or a network of networks, such as the Internet. Any or all components of electronic system 700 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer readable media does not include carrier waves and electronic signals passing wirelessly or over wired connections.

In one or more implementations, a computer program product (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa. The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method for ternary content addressable memory (TCAM) storage, the method comprising:
   receiving a packet classification rule value that comprises a port range;
   determining a first ternary representation of a numerical range that encompasses the port range; a second ternary representation corresponding to a lower bound of the port range; and a third ternary representation corresponding to an upper bound of the port range;

generating a combined ternary representation of the port range by concatenating the first ternary representation, the second ternary representation, and the third ternary representation; and storing, in a single TCAM entry, the combined ternary representation of the port range.

2. The method of claim 1, wherein generating the combined ternary representation of the port range by concatenating the first ternary representation, the second ternary representation, and the third ternary representation comprises:

generating the combined ternary representation of the port range by concatenating the first ternary representation, a separator, the second ternary representation, the separator, and the third ternary representation.

3. The method of claim 1, wherein the storing, in the TCAM entry, the combined ternary representation of the port range further comprises storing, in the TCAM entry, the combined ternary representation of the port range and a fourth ternary representation corresponding to at least one other packet classification rule value.

4. The method of claim 3, further comprising:

receiving a plurality of packet header values, wherein at least one of the plurality of packet header values comprises a port number;

performing a first bitwise operation on the port number to generate a lower bound comparator; and a second bitwise operation on the port number to generate an upper bound comparator;

generating a TCAM input value by combining the port number, the lower bound comparator, the upper bound comparator, and at least some other of the plurality of packet header values; and providing the TCAM input value for comparison with the TCAM entry.

5. The method of claim 4, wherein the first bitwise operation comprises an OR operation and the second bitwise operation comprises an AND operation.

6. The method of claim 4, wherein the at least some other of the plurality of packet header values comprises a protocol type, a source address, and a destination address.

7. The method of claim 1, wherein the first ternary representation, the second ternary representation, and the third ternary representation each comprise at least one of a zero value, a one value, or a mask value.

8. The method of claim 1, wherein the numerical range comprises a smallest numerical range encompassing the port range that is representable as a single ternary string.

9. The method of claim 1, further comprising:

determining whether the lower bound of the port range and the upper bound of the port range satisfy a port range criteria; and if the lower bound of the port range and the upper bound of the port range do not satisfy the port range criteria:
generating a sub-range of the port range;
performing the determinings, the generating, and the storing using the sub-range in place of the port range; and
storing, for each port number of the port range that is outside of the sub-range, a fifth ternary representation of each port number as an additional TCAM entry.

10. The method of claim 1, wherein the port range is determinable by subtracting first values that are below the second ternary representation of the lower bound and third values that are above the third ternary representation of the upper bound from the first ternary representation of the numerical range.

11. The method of claim 1, wherein the port range comprises at least one of a source port range or a destination port range.

12. A non-transitory machine-readable medium embodying instructions that, when executed by a machine, allow the machine to perform a method for ternary content addressable memory (TCAM) retrieval, the method comprising:

receiving a packet header comprising a plurality of values, wherein at least one of the plurality of values comprises a port number;

performing a first bitwise operation on the port number to generate a lower bound comparator; and a second bitwise operation on the port number to generate an upper bound comparator;

generating a TCAM input value by combining the port number, the lower bound comparator, the upper bound comparator, and at least some other of the plurality of values of the packet header; and providing the TCAM input value to a TCAM for comparison with individual entries of the TCAM.

13. The machine-readable medium of claim 12, wherein the first bitwise operation comprises an OR operation and the second bitwise operation comprises an AND operation.

14. The machine-readable medium of claim 12, wherein the plurality of values comprises a protocol type, a source address, a destination address, a source port number, and a destination port number.

15. A system for ternary content addressable memory (TCAM) storage, the system comprising:

a TCAM comprising entries; and a processor communicatively coupled to the TCAM, wherein the processor is operative to:
receive a first numerical range;
determine a first ternary representation of a second numerical range that encompasses the first numerical range; and a second ternary representation corresponding to at least one of a lower bound of the first numerical range or an upper bound of the first numerical range; and
store, in one of the entries of the TCAM, the first ternary representation combined with the second ternary representation.

16. The system of claim 15, wherein the first numerical range comprises a port range.

17. The system of claim 15, wherein the processor is further operative to:

determine a third ternary representation corresponding to at least one of the lower bound of the first numerical range or the upper bound of the first numerical range, wherein the third ternary representation corresponds to the lower bound when the second ternary representation corresponds to the upper bound and the third ternary representation corresponds to the upper bound when the second ternary representation corresponds to the lower bound.

18. The system of claim 17, wherein the processor is further operative to:

store, in the one of the entries of the TCAM, the first ternary representation combined with the second ternary representation and the third ternary representation.

19. The system of claim 15, wherein the processor is further operative to:
- receive a first binary value;
- perform a bitwise operation on the binary value to generate a second binary value;
- combine the first binary value and the second binary value to generate a TCAM input value;
- provide the TCAM input value for comparison with the entries of the TCAM; and
- receive an index of one of the entries of the TCAM when the one of the entries of the TCAM matches the TCAM input value, otherwise receive an indication that none of the entries of the TCAM match the TCAM input value.

20. The system of claim 19, wherein the bitwise operation comprises at least one of a binary OR operation or a binary AND operation.

21. The system of claim 15, wherein the second numerical range comprises a smallest numerical range encompassing the first numerical range that is representable as a single ternary string.

* * * * *